United States Patent [19]

Harris

[11] Patent Number: 4,692,724
[45] Date of Patent: Sep. 8, 1987

[54] HIGH POWER TUNABLE FILTER

[75] Inventor: Mark A. Harris, Clearwater, Fla.

[73] Assignee: E-Systems, Inc., Dallas, Tex.

[21] Appl. No.: 789,669

[22] Filed: Oct. 21, 1985

[51] Int. Cl.⁴ .......................... H01P 1/20; H01P 1/203
[52] U.S. Cl. .................................... 333/202; 333/205; 333/207; 333/235
[58] Field of Search ................................ 333/174–177, 333/202–212, 219–235, 236, 238, 245, 248, 258

[56] References Cited

U.S. PATENT DOCUMENTS

| | | | |
|---|---|---|---|
| 1,894,645 | 1/1933 | Trogner | 333/177 |
| 2,760,169 | 8/1956 | Engelmann | 333/204 |
| 2,867,782 | 1/1959 | Arditi | 333/205 |
| 2,945,195 | 7/1960 | Matthaei | 333/204 |
| 3,142,808 | 7/1964 | Gonda | 333/204 |
| 3,317,858 | 5/1967 | Tagawa | 333/133 |
| 3,348,173 | 10/1967 | Matthaei et al. | 333/203 |
| 3,644,850 | 2/1972 | Ho | 333/202 |
| 3,680,011 | 7/1973 | Adams et al. | 333/167 |
| 3,733,608 | 5/1973 | McGhay et al. | 333/132 |
| 3,811,101 | 5/1974 | Karp | 333/231 X |
| 3,815,137 | 6/1974 | Kaegebein | |
| 3,959,749 | 5/1976 | Ikushima et al. | 333/203 |
| 4,004,257 | 1/1977 | Geissler | 333/207 |
| 4,066,988 | 1/1978 | Karp | 333/231 |
| 4,080,601 | 3/1978 | Alcorn, Jr. | 333/202 |
| 4,151,494 | 4/1979 | Nishikawa et al. | 333/204 |
| 4,186,359 | 1/1980 | Kaegebein | 333/134 |
| 4,262,269 | 4/1981 | Griffin et al. | 333/204 |
| 4,276,525 | 6/1981 | Nishikawa et al. | 333/206 |
| 4,382,238 | 5/1983 | Makimoto et al. | 333/134 |
| 4,386,328 | 5/1983 | Masuda et al. | 333/202 |
| 4,502,029 | 2/1985 | Reed | 333/209 X |
| 4,568,895 | 2/1986 | Reed | 333/231 X |

Primary Examiner—Marvin L. Nussbaum
Attorney, Agent, or Firm—Albert M. Crowder, Jr.

[57] ABSTRACT

A high power tunable filter, for use in a frequency hopping system, is described and includes a transmission line having an input for receiving a high power level input signal to be filtered, and an output. The filter includes a plurality of resonators, each parallel-coupled to the transmission line, and driven by an associated electronic tuning network. Each of the electronic tuning networks includes a plurality of tunable reactive elements and PIN diodes, each PIN diode connected to one of the tunable reactive elements to enable this diode to connect its associated tunable reactive element in and out of the tuning network, thereby controlling the resonant frequency of the resonator associated with the tuning network. An electronic control circuit is also provided for controlling the frequency of the tunable filter. The electronic control circuit includes appropriate input circuitry for entering a desired frequency of the tunable filter, and an addressable look-up table responsive to the input circuitry for converting the desired frequency into a unique binary codeword. Switch drive circuits are also provided, responsive to the bits of the binary codeword, for controlling the operational states of the PIN diodes.

20 Claims, 5 Drawing Figures

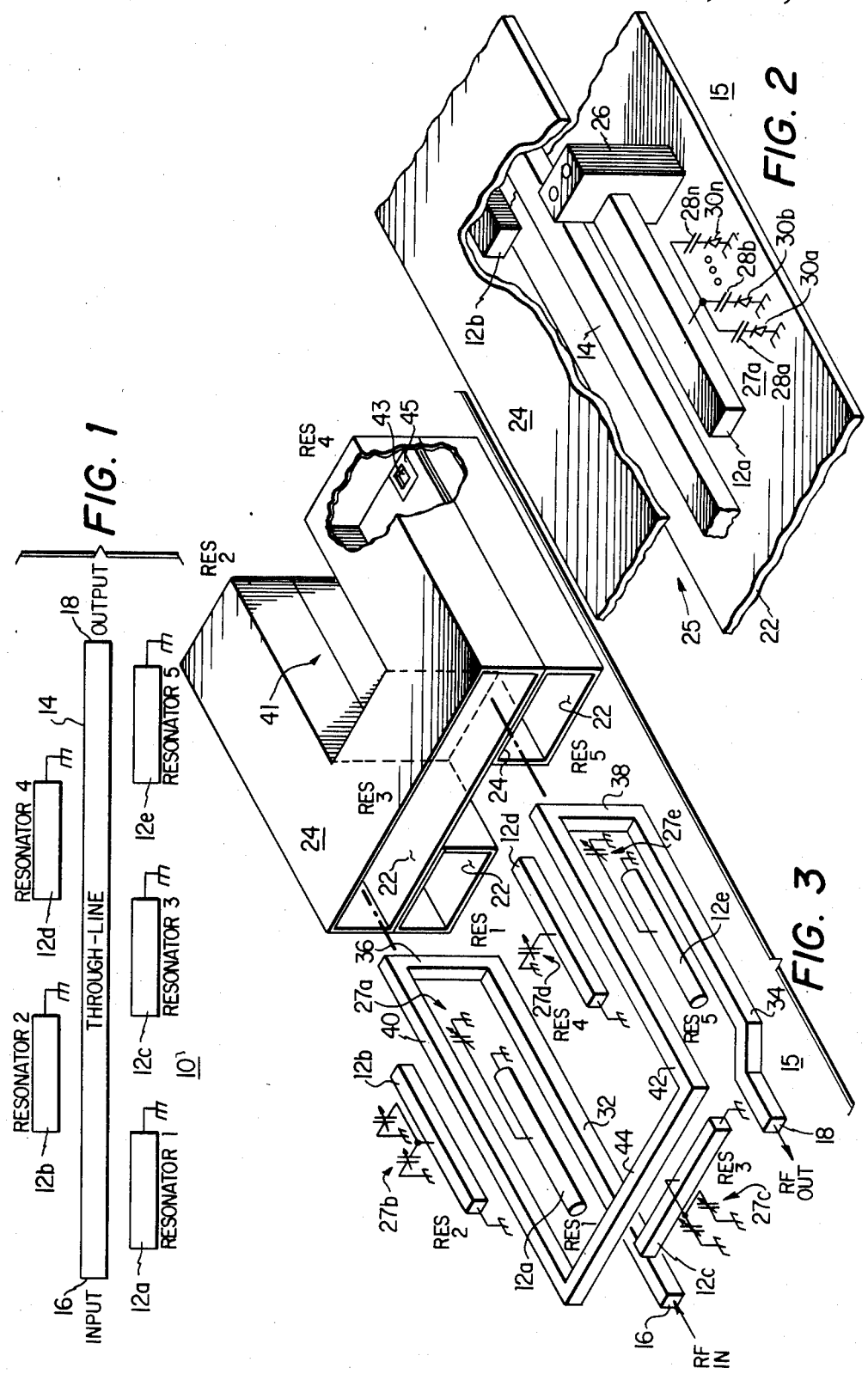

HIGH POWER TUNABLE FILTER

TECHNICAL FIELD

The United States Government has rights in this invention pursuant to Contract No. F30602-79-C-0015 awarded by the Department of the Air Force. The present invention relates to signal processing and more particularly to a high power tunable filter having a plurality of electronically-tuned resonator sections.

BACKGROUND OF INVENTION

It is well-known in the prior art to design filter structures comprising an air dielectric through-line with resonators coupled at quarter-wavelength spacings. One such structure is described in U.S. Pat. No. 4,262,269 to Griffin et al. This U.S. patent discloses a five-pole notch filter having five quality factor (Q) enhanced resonators disposed at quarter-wavelength intervals along a dielectric stripline. The center or notch frequency of this filter is determined by the quarter-wavelength mechanical dimensions of each resonator in the filter.

Such filter structures of the prior art cannot be used effectively in a frequency hopping system, where it is required to rapidly and precisely change the desired frequency of the filter notch. This is because the notch frequency of such structures is fixed, i.e., determined by the quarter-wavelength mechanical dimensions of each resonator in the filter. These filters are also impractical for use in jamming applications because to protect a colocated high sensitivity receiver, a jamming amplifier must be provided with a dynamically-variable notch filter for rejecting jamming signals.

There is therefore a need to provide an improved high power tunable filter design having frequency characteristics which may be rapidly and precisely changed compatible with the requirements of a frequency hopping system. Such a filter would also be useful to protect a high sensitivity receiver from a deliberately colocated high power broadband jammer by rejecting the jammer output at dynamically-variable received frequencies.

BRIEF DESCRIPTION OF INVENTION

The present invention relates to a high power tunable filter having a plurality of electronically-tuned resonator sections, such resonator sections facilitating rapid and precise changes in the frequency characteristics of the filter. Because the resonator sections are electronically-tuned, the tunable filter of the present invention may advantageously be used in various signal processing applications requiring dynamically-variable filter devices, e.g., a frequency hopping system or a broadband jamming system.

According to the preferred embodiment of the invention, a high power tunable filter is provided comprising a transmission line having an input for receiving an input signal to be filtered, and an output. A plurality of resonators are provided for varying a frequency characteristic of the tunable filter, e.g., the notch frequency when the filter is configured as a notch filter, each of the resonators parallel-coupled to the stripline and having a controllable resonant frequency. An electronic tuning network is provided for each of the resonators, each such tuning network including a plurality of tunable reactive elements and switches. Each of the switches is connected to one of the tunable reactive elements to enable the switch to connect its associated tunable reactive element in and out of the tuning network, thereby controlling the resonant frequency of the resonator associator with each electronic tuning network. An electronic control circuit is provided for driving the electronic tuning networks to set the frequency characteristic of the tunable filter.

The electronic control circuit includes various input devices for entering the desired frequency characteristic of the tunable filter. Appropriate conversion circuits are also provided for converting this desired frequency characteristic into a binary codeword "m+k(n−m)" bits in length, where "k" is equal to the number of resonators in the filter, "n" is equal to the number of tunable reactive elements in each tuning network, and "m" is equal to a predetermined number of most significant reactive elements in each tuning network. The tunable filter also includes a plurality of switch driver circuits for controlling the operational states of the switches. Specifically, "m" switch driver circuits are shared by the tunable networks, and serve to connect "m" of the tunable reactive elements in and out of each tuning network, the "m" tunable reactive elements providing a so-called "coarse" frequency adjustment for each of the tuning networks. The "n−m" remaining reactive elements in each tuning network are driven by "n−m" switch driver circuits associated therewith to provide a so-called "fine" frequency adjustment for each tuning network. In the preferred embodiment, each of the resonators is driven to the same resonant frequency.

The switches in the tuning networks are preferably PIN diodes, and the reactive elements therein are preferably high Q ceramic capacitors. Moreover, the filter transmission line is advantageously formed in a folded configuration, with resonators having equal ground plate spacings located on a same vertical level of the filter. When this structure is used to form a tunable notch filter, the notch depth of the filter is enhanced because the folded configuration minimizes potential feedthrough of the signal to be filtered.

BRIEF DESCRIPTION OF THE DRAWINGS

For a more complete understanding of the present invention and the advantages thereof, reference is now made to the following Description taken in conjunction with the accompanying Drawings in which:

FIG. 1 is a schematic diagram of a notch filter of the prior art having a plurality of resonator sections parallel-coupled to a transmission line;

FIG. 2 is a perspective view, partly cutaway, of a notch filter according to the present invention, which includes an electronic turning network coupled to each resonator section;

FIG. 3 is an exploded schematic diagram of a high power tunable filter of the present invention having a folded configuration;

DETAILED DESCRIPTION

Figure 4:
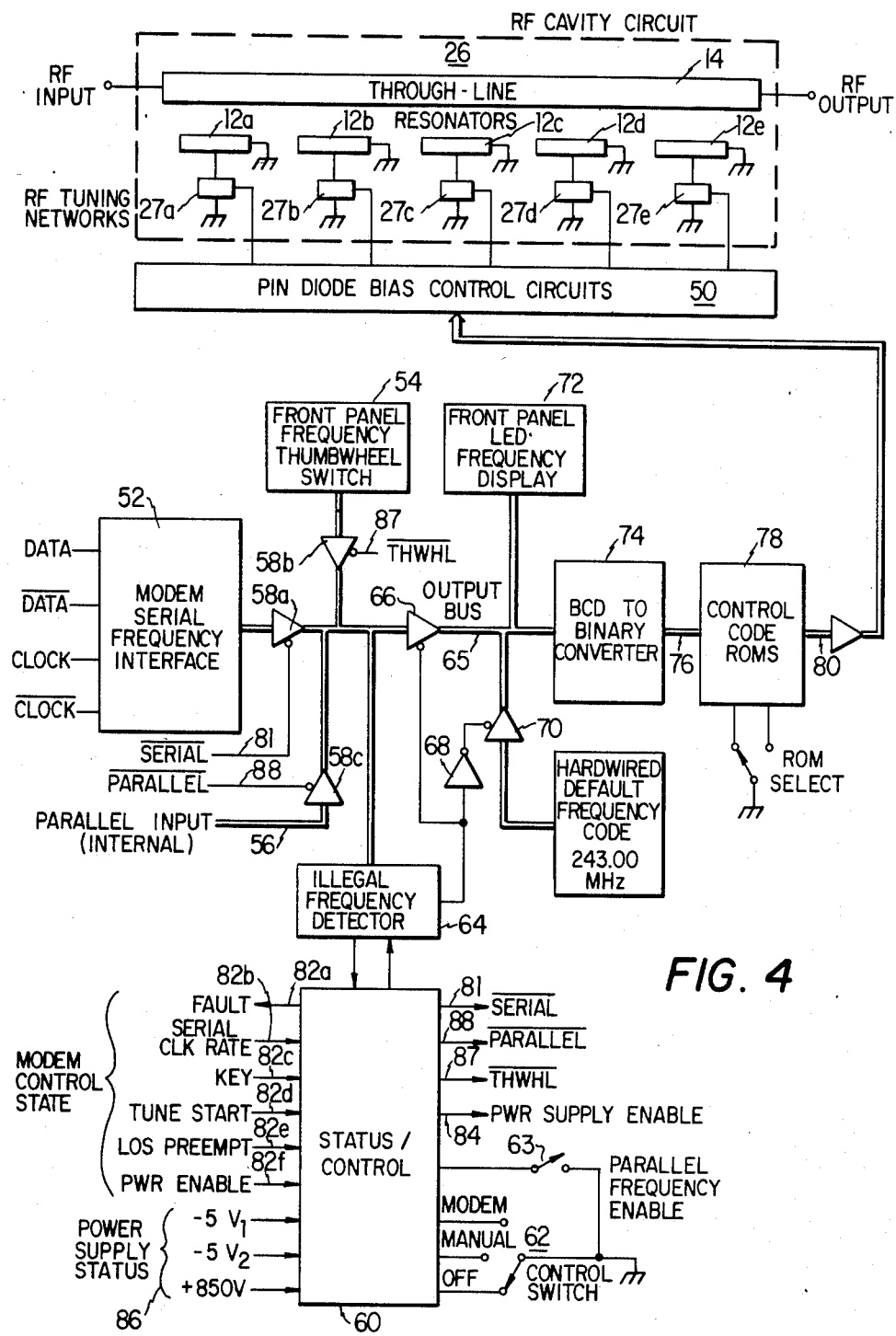
FIG. 4 is a schematic block diagram of the electronic control circuitry of the present invention for driving the electronic tuning networks associated with each resonator section.

Referring now to the FIGURES, wherein like reference characters designate like to similar parts throughout the several views, FIG. 1 is a schematic diagram of a notch filter 10 of the prior art having a plurality of resonator sections 12a–12e parallel coupled to a transmission line 14. The notch filter 10 includes an input 16 for receiving a signal to be filtered, and an output 18 for transferring the filtered signal from the filter 10. In the preferred construction of the filter 10, each of the resonators 12a–12e is disposed at quarter-wavelength intervals along the transmission line 14. The structure of FIG. 1 provides an accurate notch filter having a center frequency determined by the quarter-wavelength mechanical dimension of each resonator section 12a–12e.

The notch filter structure of FIG. 1, characterized by a fixed center frequency determined by the mechanical dimensions of the resonators, is incompatible with a frequency hopping system. As is well-known in the prior art, such systems require rapid and precise changes in the center frequency of the notch filter to facilitate processing of high power level input signals. A dynamically-variable notch filter, however, can be realized according to the present invention, using the basic parallel-coupled resonator structure in FIG. 1.

With reference now to FIG. 2, a perspective view, partially cutaway, is shown of the physical realization of a filter 15 according to the present invention. Filter 15 includes a bottom ground plane 22 and a top ground plane 24 defining a filter cavity 25 having air as the preferred dielectric material therein. The filter 15 includes the transmission line 14 which may be a stripline or a coaxial line, and the resonators 12a–12e as discussed above with respect to FIG. 1, except that the resonators are fore-shortened to compensate for the stray reactance effects of an electronic tuning network 27a, to be described. Specifically, resonator 12a is supported in a grounding block 26, with resonator 12b spaced therefrom at a distance equal to a quarter-wavelength on the transmission line 14. This filter structure achieves high resonator unloaded Q's, low pass band loss, controllable voltage standing wave ratio (VSWR), and high power handling capability.

According to an important feature of the present invention, an improved tunable filter 15 is provided by varying the center frequency of each resonator parallel-coupled to the common transmission line 14 through the use of the electronic tuning network 27a.

With reference to FIG. 2, the electronic tuning network 27a includes a plurality of reactive elements 28a . . . 28n, preferably high Q ceramic tunable capacitors, each of which is switched in and out of the resonator 12a circuit by one of a plurality of switches 30a . . . 30n. In the preferred embodiment, each of the switches 30a . . . 30n is a high power PIN diode, and each is connected to one of the tunable capacitors 28a . . . 28n, to enable the PIN diode to connect the associated tunable capacitor in and out of the tuning network 27a. Because the capacitors 28a . . . 28n are physically coupled into the filter cavity 25, the resonant frequency of each resonator in the filter is dynamically-variable, depending on the number of capacitors 28a . . . 28n that are in the resonator circuit.

In the preferred embodiment of the invention, and as will described in more detail below, the tuning network 27a includes seven (7) tunable capacitors 28 and PIN diodes 30, for representing $2^7$ (128) different possible binary combinations of the tunable capacitors 28. By properly selecting and weighting the values of the tunable capacitors 28a . . . 28n, a predetermined frequency tuning range is covered uniformly. For example, the resonant frequency of the resonator 12a may be changed to uniform values within a 240–252 MHz tuning range, with tuning increments of 150 kHz, by switching the PIN diodes 30a . . . 30n through $2^7$ (128) binary codes.

Although the filter 15 of FIG. 2 shows only one resonator 12a including an electronic tuning network, it should be appreciated that each of the resonators 12 of the filter may include a similar circuit. Moreover, although the tuning network 27a of FIG. 2 includes seven (7) tunable capacitors and PIN diodes, any number more or less of such elements may be provided for subdividing the tunable resonant frequency of each resonator. Further, although filter 15 of FIG. 2 includes five (5) resonators, corresponding to a five-pole Butterworth filter, the filter 15 may comprise any number of resonators depending on the desired frequency characteristic.

The high power notch filter of FIG. 2 is advantageous because it provides electronically-tuned resonator sections which may be rapidly and precisely set to a desired frequency compatible with a frequency hopping system. Moreover, use of a PIN diode switches to couple the tunable capacitors in and out of the tunable networks allows very large signals to be efficiently handled by the filter without signal degradation.

To achieve the coupling and impedance levels required to obtain a five-pole Butterworth response, unloaded Q, high power handling, mechanical stability under vibration, minimal input VSWR, and a suitable cavity for support electronics, the filter 15 of the present invention preferably incorporates the resonator layout shown in FIG. 3, which is an exploded view of the preferred filter configuration. As seen in this FIGURE, the transmission line 14 comprises longitudinal sections 32 and 34 defining a lower level of the filter 15, vertical riser sections 36 and 38, and upper longitudinal sections 40 and 42 connected by the transverse section 44. Sections 40, 42 and 44 of the transmission line 14 define an upper level of the filter. As also seen in FIG. 3, resonators 12a and 12e are formed in circular cross-section and are mounted on the lower level of the filter 15. The circular cross-section of resonators 12a and 12e maximizes the unloaded Q of the filter input 16 and output 18 to enhance the power handling capability of the filter 15. In contradistinction, resonators 12b, 12c and 12d are mounted on the upper level of the filter. Each of the resonators 12b, 12c and 12d has a rectangular cross-section because these resonators have lower power handling requirements.

As also shown in detail in FIG. 3, the bottom and top ground planes 22 and 24 of FIG. 2 are provided in the upper and lower levels of the filter 15, and "U"-shaped cavity walls 41 are provided inside the filter for further reducing the stray direct coupling between resonators 12a and 12e, and 12b and 12d. FIG. 3 also shows an aperture 43 in the rear portion of the filter for receiving the vertical riser section 38 of the transmission line 14. A dielectric insulator 45 is provided to insulate the riser section 38 from the adjacent ground planes 22 and 24. The other side of the filter 15 has a similar structure (not shown) for the vertical riser section 36 of the transmission line 14. Moreover, although also not shown in detail, the resonators 12b, 12c and 12d are located closer to their associated ground planes than the resonators 12a and 12e are located with respect to their associated ground planes. The use of smaller plate spacings for the upper level resonators 12b, 12c and 12d reduces the unloaded Q of these resonators by approximately 10 percent. However, the lower external Q of these resonators permits much greater rejection as compared to the input/output resonators 12a and 12e.

The folder filter configuration of FIG. 3, which places the resonators with equal ground plate spacings on the same level, and utilizes vertical transmission line riser sections 36 and 38 to make the transition between levels, is advantageous because it enhances the ultimate notch depth of the filter by minimizing potential feed-through of the signal to be filtered. Because the filter design is bilateral, and high power handling design techniques are used on resonators 12a and 12e, the filter input and output may also advantageously be interchanged.

Referring now to FIG. 4, a schematic block diagram is shown of the electronic control circuitry for driving the electronic tuning networks 27a–27e for the resonators 12a–12e, respectively, of FIG. 3. Generally, the electronic control circuitry of FIG. 4 processes signals from various frequency input sources, and receives control and status information to determine a binary codeword, which in turn drives PIN diode bias control circuits 50 to control the filter center frequency. As will be described in more detail, to minimize the number of PIN diode driver circuits 50 required, the four (4) most significant capacitors of each tuning network, corresponding to the four most significant bits (MSB's) of the binary codeword, are driven in parallel for all five tuning networks, with the three (3) least significant capacitors of each network being individually-controlled.

Referring now to FIG. 4, raw frequency command inputs to the filter come from one of three sources, a modem serial interface circuit 52, a front panel thumbwheel switch circuit 54, or an internal latched parallel input 56. The output from each of these sources is a binary coded decimal (BCD) signal, which is gated through an appropriate tri-state logic device 58a–58c, respectively, under the control of a status/control circuit 60. In particular, status/control circuit 60 includes an associated three position control switch 62, and an internal parallel-input enable switch 63. An illegal frequency detector circuit 64 monitors the output lines of the tri-state devices 58a–58c to check for "legal" BCD codes, and to ensure that the selected frequency is within a preselected filter tuning range. The status/control circuit 60 also supplies an input when the filter is controlled by the interface circuit 52 to insure that the proper modem control state is in effect. If all of the proper operating conditions are met, the desired frequency code is transferred to an output bus 65 via a tri-state gate 66 enabled by the illegal frequency detector circuit 64. Otherwise, a hardwired default frequency is passed to the output bus 65 by enabling tri-state logic gates 68 and 70. Preferably, the hardwired default frequency is predetermined to be 243.000 MHz to tune the notch to a "guard" (protected) frequency.

The BCD encoded frequency on the output bus 65 is routed to a front panel LED frequency display 72 to indicate the present operating frequency, and also to a BCD to binary converter circuit 74. Converter circuit 74 is provided because in the preferred embodiment of the invention 481 different frequencies are tuned within the filter operating range, and thus nine (corresponding to $2^9$) control lines are required. The nine bit output of the BCD to binary converter circuit 74 is transferred via bus 76 to a plurality of storage devices, designated generally by the reference numeral 78. Storage circuit 78 includes a plurality of programmable read only memories (PROM's), or erasable programmable read only memories (EPROM's), receive the nine bit binary representation from bus 76, and in response thereto, generate a binary codeword "n+k(n−m)" bits in length on an output bus 80. As used herein "k" is equal to the number of resonators in the filter, "n" is equal to the number of tunable capacitors in each tuning network, and "m" is equal to a predetermined number of most significant capacitors in each tuning network. The storage circuit 78 thus forms a so-called "lookup table" which stores the predetermined unique tuning codewords therein for tuning the filter. For each frequency within the preferred frequency range of the filter, a nine (9) bit binary address from 0 to 480 (240.000 to 252.000 MHz, respectively) is applied to the storage device 78 by the circuit 74, causing the unique "m+k(n−m)" bit codeword to be applied to the output bus 80. With the preferred filter structure of FIG. 3; i.e., five (5) resonators and seven (7) tunable capacitors in each tuning network, four (4) of which being the most significant, nineteen (19) bits are required for each codeword.

In operation, the four (4) most significant bits of the codeword are shared by the four (4) most significant capacitors in all five (5) tuning networks to provide a "coarse" frequency adjustment for each tuning network. The remaining fifteen (15) bits of the codeword, in five groups of three (3) capacitors in each resonator to provide a "fine" frequency adjustment.

To program the codewords, a curve of required capacitance versus frequency is first generated. This curve is dependent on the characteristic impedance of each resonater 12, the amount of fore-shortening thereof, and the location of each tuning network 27. For the desired tuning increment in frequency, a minimum change of capacitance (or other reactance) is then determined at a point where the sensitivity of capacitance (or other reactance) is the greatest from the curve; i.e., dx/df is evaluated at its minimum for the specified frequency increment. This procedure establishes the minimum change in capacitance required to achieve the tuning resolution desired. Thereafter, the (E)PROM's 78 are removed and toggle switches are connected to the output lines of the output bus 80. All tuning bits are then turned OFF. A capacitor is then picked such that the total circuit capacitance change of the selected capacitor in series with an "off" capacitance of the corresponding PIN diode switch and the selected capacitor yields the desired capacitance increment. This procedure is then repeated for twice the change, four times the minimum change in capacitance, and up to $2^N$ times the minimum change, where N is the number of bits required to cover the tuning range. Following the selection of codewords, the total capacitance of the case where all PIN diodes are "off" (stray capacitance) and all PIN diodes are "on" is compared to the curve to insure that the desired tuning range is covered. If corrections are required, the resonator design parameters are varied and the process repeated.

In operation, the status/control circuit 60 monitors various operating states of the filter and controls the filter function. When the control switch 62 is placed in the OFF position, the filter is deactivated and cannot be operated. When the control switch 62 is placed in the MODEM position, the modem serial frequency interface circuit 52 is controlled by the status/control circuit 60, which actuates tri-state gate 58a via output line 81 to control the operating frequency of the filter 15. The modem control state is monitored via the lines 82a–82f, and the filter primary power is controlled via the modem power enable output 84. For normal operation, the modem must indicate that a serial clock rate on line 82b is at logic low, and a key, a tune start, and an LOS preempt signal on lines 82c, 82d and 82e is at logic high, which indicates that the system is in a receive mode to be protected by the notch filter. Otherwise, the filter sends a fault condition and defaults to the hardwired default frequency. The three PIN diode bias supplies 86 (as best seen in FIG. 5) are also monitored by the status/control circuit 60 and a fault indicated in the event of the failure.

To provide manual entry of the desired frequency, control switch 62 is moved to the MANUAL setting, and the operator may enter input information via the thumbwheel switch circuit 54. In this operational state, status/control circuit 60 enables tri-state gate 58b via output line 87. For testing purposes, the control switch 63 is enabled, allowing an internal parallel input 56 to be entered. In this state, status/control circuit 60 enables tri-state gate 58c via output line 88.

Figure 5:
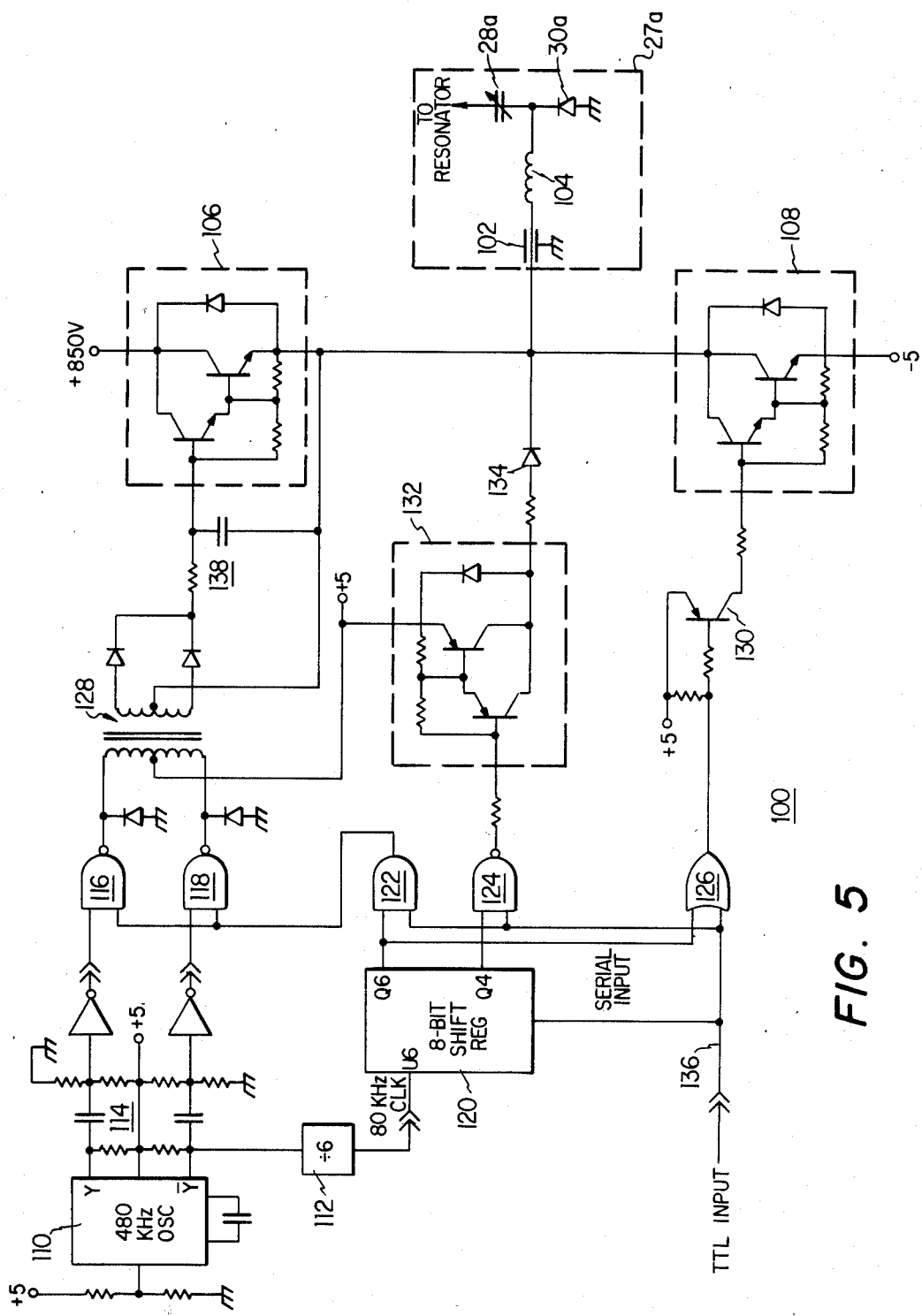
FIG. 5 is a detailed schematic diagram of a PIN diode driver circuit for controlling the operation of each PIN diode of the electronic tuning network of FIG. 2.

Referring now to FIG. 5, a detailed schematic diagram of a PIN diode driver circuit of the control circuit 50 for one of the PIN diodes is shown. It should be appreciated that in the preferred embodiment of the invention nineteen (19) of the circuits shown in FIG. 5 are provided because the four (4) most significant bits (MSB's) of each codeword are used to connect the four (4) most significant capacitors in and out of each of the five (5) tuning networks, and the remaining fifteen (15) bits of the codeword, in five (5) groups of three (3) bits, individually control the remaining three (3) capacitors in each network. To obtain the optimum unloaded Q and minimal power dissipation, graduated diode forward bias currents from 0.25 to 0.50 amps are used, while a reverse bias voltage of 850 volts is used to maximize diode OFF resistance and power handling capability.

Such operation is provided by the PIN diode driver circuit 100 of FIG. 5. PIN diode driver circuit 100 drives the PIN diode 30a, which in turn couples its associated tuning capacitor 28a in and out of the associated resonator circuit. The tunable network 20 also includes a feedthrough capacitor 102 and a choke 104 for decoupling purposes. Electronic tuning network 27a is driven by the Darlington amplifiers 106 and 108. A common buffered 480 kHz TTL oscillator 110 and a divide-by-six counter 112 are provided in the PIN diode driver circuit 100 for timing signals. A resistor-capacitor oscillator coupling network 114 is provided to ensure that a transformer driver circuit, comprising NAND gates 116 and 118, returns to a protected state if the oscillator 110 fails. The divide-by-six counter 112 provides a clock signal to an 8-bit timing shift register 120, the outputs of which drive control/driver gates, specifically AND gate 122, NAND gate 124 and OR gate 126.

Bias for Darlington circuit 106, which reverse biases PIN diode 30a, is developed by a transformer 128, which couples the 480 kHz signal generated by oscillator 110 through the gates 116 and 118 when such gates are enabled by the output of AND gate 122. Bias for Darlington circuit 108, which forward biases PIN diode 30a, is developed by transistor 130, which is enabled by the output of OR gate 126. The circuit consisting of NAND gate 124, Darlington amplifier 132 and diode 134 is provided to speed-up the transition between forward bias and reverse bias of the PIN diode 30a. The timing shift register 120, and the control/driver gates 122, 124 and 126, are provided to ensure that the Darlington amplifiers 106 and 108 are not simultaneously conducting.

The PIN diode driver circuit 100 operates as follows for and OFF to ON input transition provided on line 136, which as noted above comprises one bit of a binary codeword output from the storage device 78 as discussed above with respect to FIG. 4. Before the input changes from OFF to ON, the outputs Q4 and Q6 of the shift register 120, and the outpus of AND gate 122 and OR gate 126, are logic high, with the output of the NAND gate 124 being logic low. Therefore, Darlington amplifiers 106 and 132 are enabled, and Darlington amplifier 108 is disabled, biasing the PIN diode 30a OFF. When the input changes from a logic high to a logic low, i.e., goes from an OFF to ON transition, the outputs of AND gate 122 and NAND gate 124 immediately change state, turning OFF Darlington amplifiers 106 and 132. After five complete clock periods, the Q6 output of the shift register 120 changes to a logic low, turning ON Darlington amplifier 108 and forward biasing the PIN diode 30a. The five clock periods permit the high voltage transistors in the Darlington amplifier 106 to turn completely OFF before bias is applied to Darlington amplifier 108. Conversely, an ON to OFF transition occurs as follows. Before the input on line 136 changes from logic low to logic high, the Q4 and Q6 outputs of the shift register 120 and the outputs of AND gate 122 and OR gate 126 are logic low, with the output of NAND gate 124 being logic high. This results in Darlington amplifiers 106 and 132 being biased OFF, and Darlington amplifier 108 being biased ON. At the receipt of the input change, the output of OR gate 126 immediately changes state, turning Darlington amplifier 108 OFF. After three clock periods; i.e., corresponding to the Q4 output of shift register 120, the output of NAND gate 124 changes from logic high to logic low, turning ON the charge stripping Darlington amplifier 132. After two additional clock periods; i.e., corresponding to the Q6 output of shift register 120, the output of AND gate 122 goes to logic high, enabling the 480 kHz oscillator 110 to drive the transformer 128 via NAND gates 116 and 118. The detected output quickly turns ON Darlington amplifier 106 because of a short time constant filter 138, and the small base current required to drive the Darlington amplifier 106.

As described above, the PIN diode driver circuit 100 of FIG. 5 is duplicated preferably nineteen times such that four (4) of such circuits are used to drive the four most significant capacitors, corresponding to the four MSB's of the codeword, of each electronic tuning network 27a–27e. This provides a so-called "coarse" frequency adjustment for the tuning network. The least three (3) significant capacitors of each tuning network are driven by the remaining fifteen (15) additional driver circuits 100, with three (3) such circuits in each tuning network, to provide a so-called fine frequency adjustment. By properly selecting the tunable capacitors, a preferred 240-252 MHz tuning range is covered uniformly, with a maximum tuning increment of 150 kHz, by switching the seven (7) PIN diodes in each tuning network through $2^7$ or 128 binary codes. Preferably, each of the resonators of the filter are tuned to the same resonant frequency to set the overall frequency of the tunable filter.

In the preferred embodiment, the high power tunable filter of the present invention is used as a notch filter to facilitate operation of a frequency hopping system. It should be appreciated that although the invention has been described in the context of a notch filter structure, the concept of controlling filter operating characteristics through the described electronically-tuned networks is applicable to all filter structures, including bandpass, low pass and high pass filters. The described filter advantageously provides a five-pole Butterworth filter consisting of electronically tuned resonators parallel-coupled to a common through-line. This structure achieves an 87 dB notch with a 3 dB bandwidth of 3 MHz, out-of-band loss of less than 0.5 dB, and RF power-handling capability of several hundred watts. The resonators, each consisting of a fore-shortened transmission line in a cavity circuit, with a fixed reactive element set forming a primary resonant circuit and a lightly coupled PIN diode-switched reactive element in a secondary circuit, handles high power levels with maximum linearity to permit tuning within 70 microseconds.

Although the invention has been described in detail, it is to be clearly understood that the same is by way of illustration and example only and is not to be taken by way of limitation, the spirit and scope of the invention being limited only by the terms of the appended claims.

I claim:
1. A high power tunable filter, comprising:
   a transmission line having an input, for receiving a signal to be filtered, and on an output, the transmission line having first and second portions and means for interconnecting the first and second portions, the first portion of the transmission line located in a first plane and the second portion of the transmission line located in a second plane substantially parallel to the first plane;
   a plurality of resonators, each parallel-coupled to said transmission line and having a controllable resonant frequency;
   an electronic tuning network coupled to each of said resonators for controlling the resonant frequency thereof, each such tuning network including:
   one or more tunable reactive elements; and
   one or more switches, each of said switches connected to one of said tunable reactive elements to enable said switch to connect the associated tunable reactive element in and out of said tuning network, thereby controlling the resonant frequency of the resonator coupled to said tuning network; and
   means for driving said electronic tuning networks to set a frequency characteristic of said tunable filter.

2. The high power tunable filter as described in claim 1 wherein said means for driving said electronic tuning networks comprises:
   input means for entering a desired frequency of said tunable filter;
   means responsive to said input means for converting said desired frequency into a binary codeword; and
   means responsive to said converting means for controlling an operational state of each of said switches in said tuning networks.

3. The high power tunable filter as described in claim 2 wherein said means for controlling comprises:
   a plurality of switch driver circuits responsive to bits of said binary codeword for connecting said tunable reactive elements in and out of said tuning networks.

4. The high power tunable filter as described in claim 3 wherein said binary codeword is "m+k(n−m)" bits in length, where "k" is equal to a number of resonators coupled to the tunable filter, "n" is equal to a number of said tunable reactive elements in each said tuning network, and "m" is equal to a predetermined number of most significant reactive elements in said tuning network.

5. The high power tunable filter as described in claim 4 wherein "m" switch driver circuits are shared by the tuning networks, and serve to connect "m" of said tunable reactive elements in and out of each tuning network, said "m" tunable reactive elements providing a coarse frequency adjustment for each said tuning network.

6. The high power tunable filter as described in claim 5 wherein "n−m" switch driver circuits are provided in each of the tunable networks for connecting "n−m" of said tunable reactive elements in and out of each such tunig network, said "n−m" tunable reactive elements providing a fine frequency adjustment for each said tuning network.

7. The high power tunable filter as described in claim 2 wherein said input means is a modem serial frequency interface circuit.

8. The high power tunable filter as described in claim 2 wherein said means for converting includes memory means having predetermined binary codewords stored in addressable locations therein.

9. The high power tunable filter as descibed in claim 1 wherein each of said plurality of switches is a PIN diode.

10. The high power tunable filter as described in claim 1 wherein said means for interconnecting the first and second portions of the transmission line is located in a third plane substantially perpendicular to the first plane.

11. The high power tunable filter as described in claim 1 wherein the resonators adjacent said input and said output of said transmission line are mounted along said first portion of said transmission line.

12. The high power tunable filter as described in claim 11 wherein a remainder of said plurality of resonators are mounted along said second portion of said transmission line.

13. The high power tunable filter as described in claim 12 wherein said second portion of said transmission line is substantially U-shaped.

14. A high power tunable notch filter, comprising:
   a transmission line having an input, for receiving a high power level input signal to be filtered, and an ouptput, the transmission line having first and second portions and means for interconnecting the first and second portions, the first portion of the transmission line located in a first plane and the second portion of the transmission line located in a second plane substantially parallel to the first plane;
   a plurality of resonators, each parallel-coupled to said transmission line and having a controllable resonant frequency;
   an electronic tuning network coupled to each of said resonators for controlling the resonant frequency thereof, each such tuning network including:
   a plurality of tunable capacitors; and
   a plurality of PIN diodes, each of said PIN diodes connected to one of said tunable capacitors to enable said PIN diode to connect the associated tunable capacitor in and out of said tuning network, thereby controlling the resonant frequency of the resonator coupled to said tuning network;

input means for entering a desired notch frequency of said tunable filter;

an addressable look-up table responsive to said input means for converting said desired frequency into a binary codeword "m+k(n−m)" bits in length, where "k" is equal to a number of resonators coupled to the tunable filter, "n" is equal to a number of said tunable capacitors in each said tuning network, and "m" is equal to a predetermined number of most significant capacitors in each said tuning network; and a plurality of switch driver circuits for controlling the operational states of said PIN diodes.

15. The high power tunable notch filter as described in claim 14 wherein "m" switch driver circuits are shared by said tuning networks, and serve to connect "m" tunable capacitors in and out of each said tuning network, said "m" tunable capacitors providing a coarse frequency adjustment for each said tuning network.

16. The high power tunable notch filter as described in claim 15 wherein "n−m" switch driver circuits are provided in each tuning network for connecting "n−m" of said tunable capacitors therein in and out of each said tuning network, said "n−m" tunable capacitors providing a fine frequency adjustment for each said tuning network.

17. The high power tunable notch filter as described in claim 14 wherein said means for interconnecting the first and second portions of the transmission line is located in a third plane substantially perpendicular to the first plane.

18. The high power tunable notch filter as described in claim 17 wherein the resonators associated with said input and output of said filter have a substantially circular cross-section and are mounted along said first portion of said transmission line, with a remainder of said plurality of resonators each having a substantially rectangular cross-section and being mounted along said second portion of said transmission line.

19. A high power tunable notch filter, comprising:
a transmission line having an input for receiving a high power level input signal to be filtered, and an output, said transmission line having first and second portions and means for interconnecting the first and second portions, the first portion of transmission line located in a first plane and the second portion of the transmission line located in a second plane substantially parallel to the first plane;

a plurality of resonators, each parallel-coupled to said transmission line and having a controllable resonant frequency;

an electronic tuning network coupled to each of said resonators for controlling the resonant frequency thereof, each such tuning network including:

a plurality of tunable capacitors; and a plurality of PIN diodes, each of said PIN diodes connected to one of said tunable capacitors to enable said PIN diode to connect the associated tunable capacitor in and out of said tuning network, thereby controlling the resonant frequency of the resonator coupled to said tuning network;

input means for entering a desired notch frequency of said tunable filter;

means responsive to said input means for converting said desired frequency into a binary codeword "m+k(n−m)" bits in length, where "k" is equal to a number of resonators coupled to the tumble filter, "n" is equal to a number of said tunable capacitors in each said tuning network, and "m" is equal to a predetermined number of most significant capacitors in each said tuning network; and means responsive to said converting means for controlling an operational state of each said PIN diode in said tuning networks to thereby set the desired notch frequency of said tunable notch filter.

20. A high power tunable filter, comprising:
a transmission line having an input and an output, the transmission line having first and second portions and means for interconnecting the first and second portions, the first portion of the transmission line located in a first plane and the second portion of the transmission line located in a second plane substantially parallel to the first plane;

a plurality of resonators parallel-coupled to said first and second portions of the transmission line and each having a controllable resonant frequency;

means coupled to each of said resonators for tuning the resonant frequency thereof:

input means for entering a desired frequency characteristic of said tunable filter;

means responsive to said input means for converting said desired frequency characteristic into a control signal; and means responsive to said converting means for controlling said tuning means to set the frequency characteristic of said tunable filter.

* * * * *